United States Patent
Sekiya (10) Patent No.: US 10,818,546 B2
(45) Date of Patent: Oct. 27, 2020

(54) METHOD OF LASER-PROCESSING DEVICE WAFER

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/730,940

(22) Filed: Oct. 12, 2017

(65) Prior Publication Data

US 2018/0108565 A1    Apr. 19, 2018

(30) Foreign Application Priority Data

Oct. 14, 2016 (JP) .................................. 2016-203064

(51) Int. Cl.

| | |
|---|---|
| *H01L 23/00* | (2006.01) |
| *H01L 21/768* | (2006.01) |
| *B23K 26/359* | (2014.01) |
| *B23K 26/08* | (2014.01) |
| *B23K 26/16* | (2006.01) |
| *B23K 26/38* | (2014.01) |
| *H01L 21/67* | (2006.01) |
| *H01L 21/78* | (2006.01) |
| *B23K 101/40* | (2006.01) |

(52) U.S. Cl.
CPC .... *H01L 21/76894* (2013.01); *B23K 26/0869* (2013.01); *B23K 26/16* (2013.01); *B23K 26/359* (2015.10); *B23K 26/38* (2013.01); *H01L 21/67092* (2013.01); *H01L 21/78* (2013.01); *B23K 2101/40* (2018.08)

(58) Field of Classification Search
CPC ............... H01L 21/76894; H01L 21/78; H01L 21/67092; H01L 23/562; B23K 26/0869; B23K 26/38; B23K 26/16; B23K 2101/40; B23K 2201/40
See application file for complete search history.

(56) References Cited

U.S. PATENT DOCUMENTS 9,640,420 B2 *  5/2017  Nakamura .......... H01L 21/6836
9,761,442 B2 *  9/2017  Iwamoto ............. H01L 21/0206
(Continued)

FOREIGN PATENT DOCUMENTS

| JP | 2006-140311 | 6/2006 |
| JP | 2008-126302 | 6/2008 |

*Primary Examiner* — Bitew A Dinke
(74) *Attorney, Agent, or Firm* — Greer Burns & Crain, Ltd.

(57) ABSTRACT

There is provided a method of laser-processing a device wafer with a laser beam applied thereto. The device wafer has a face side having thereon a plurality of crossing projected dicing lines and devices formed in respective areas demarcated by the projected dicing lines. The method includes a covering step of supplying the face side of the device wafer with water and a powdery protective film agent to cover the face side with an aqueous solution in which the powdery protective film agent is dispersed, a protective film forming step of evaporating the water content of the aqueous solution to form a protective film on the face side, and a laser processing step of applying a laser beam having a wavelength that is absorbable by the device wafer to the device wafer along the projected dicing lines to form laser-processed grooves in the device wafer along the projected dicing lines.

4 Claims, 6 Drawing Sheets

(56) References Cited

U.S. PATENT DOCUMENTS

| | | | |
|---|---|---|---|
| 2004/0112880 A1* | 6/2004 | Sekiya | B23K 26/032 |
| | | | 219/121.69 |
| 2005/0106782 A1* | 5/2005 | Genda | B23K 26/18 |
| | | | 438/118 |
| 2006/0105544 A1* | 5/2006 | Takanashi | C09D 5/32 |
| | | | 438/460 |
| 2006/0216911 A1* | 9/2006 | Yoshikawa | B23K 26/40 |
| | | | 438/460 |
| 2009/0239355 A1* | 9/2009 | Fukaya | H01L 21/78 |
| | | | 438/465 |
| 2011/0059620 A1* | 3/2011 | Kitahara | H01L 21/56 |
| | | | 438/782 |
| 2012/0003816 A1* | 1/2012 | Shimotani | H01L 21/78 |
| | | | 438/462 |
| 2013/0087947 A1* | 4/2013 | Kitahara | H01L 21/78 |
| | | | 264/400 |
| 2013/0087949 A1* | 4/2013 | Kitahara | H01L 21/78 |
| | | | 264/400 |
| 2014/0141596 A1* | 5/2014 | Matsuzaki | H01L 21/78 |
| | | | 438/462 |
| 2015/0104930 A1* | 4/2015 | Aikawa | H01L 21/78 |
| | | | 438/462 |
| 2016/0172312 A1* | 6/2016 | Nakamura | H01L 21/78 |
| | | | 438/462 |
| 2018/0102288 A1* | 4/2018 | Bae | B23K 26/0063 |

* cited by examiner

METHOD OF LASER-PROCESSING DEVICE WAFER

BACKGROUND OF THE INVENTION

Field of the Invention

The present invention relates to a method of processing a wafer such as a semiconductor wafer, an optical device wafer, or the like by way of ablation with a laser beam applied thereto after the face side of the wafer has been coated with a water-soluble protective film.

Description of the Related Art

Wafers such as silicon wafers, sapphire wafers, etc. with a plurality of devices such as integrated circuits (ICs), large-scale integration (LSI) circuits, light emitting diodes (LEDs), etc. disposed in areas thereon demarcated by projected dicing lines and formed on their surfaces are divided by a processing apparatus into individual chips, which will be widely used in various electric appliances including mobile phones, personal computers, etc. A dicing method using a cutting apparatus called a dicing saw is widely used to divide wafers. According to the dicing method, a cutting blade made of abrasive grains of diamond or the like that are bound together by metal or resin and having a thickness of approximately 30 µm is rotated at a high speed of approximately 30000 rpm and displaced to cut into a wafer, dividing the wafer into individual device chips.

In recent years, there has been proposed a method of applying a pulsed laser beam that has a wavelength absorbable by a wafer to the wafer to form laser-processed grooves therein and breaking the wafer along the laser-processed grooves with a breaking apparatus, thereby dividing the wafer into individual device chips. The method of forming laser-processed grooves in a wafer with a laser processing apparatus provides a higher processing rate than the dicing method that uses the dicing saw and makes it relatively easy to process wafers made of hard materials such as sapphire, SiC, or the like. In addition, since the laser-processed grooves can have a width as small as 10 µm or less, the method performed by the laser processing apparatus is able to produce higher yields of device chips per wafer than the dicing method.

However, when a wafer is irradiated with a pulsed laser beam, the wafer is littered with debris produced from thermal energy concentrating on areas where the pulsed laser beam is applied. If debris is deposited on device surfaces on the wafer, then it tends to lower the quality of devices produced from the wafer. In order to solve problems caused by debris on laser-processed wafers, Japanese Patent Laid-open No. 2006-140311, for example, has proposed a laser processing apparatus which coats a surface to be processed of a wafer with a water-soluble resin such as polyvinyl alcohol (PVA), polyethylene glycol (PEG), or the like to form a protective film over the wafer surface, and applies a pulsed laser beam to the wafer through the protective film.

SUMMARY OF THE INVENTION

However, an aqueous solution of liquid resin such as an aqueous solution of PVA, an aqueous solution of PEG, or the like is bulky and hence costly to carry, transport, and manage. As a result, the cost of device chips produced from laser-processed wafers is likely to increase.

It is therefore an object of the present invention to provide a method of laser-processing a device wafer at a lower fabrication cost than heretofore.

In accordance with an aspect of the present invention, there is provided a method of laser-processing a device wafer with a laser beam applied thereto, the device wafer having a face side having thereon a plurality of crossing projected dicing lines and devices formed in respective areas demarcated by the projected dicing lines, the method including a covering step of supplying the face side of the device wafer with water and a powdery protective film agent (i.e. a protective film agent in dry powder form) to cover the face side with an aqueous solution in which the powdery protective film agent is dispersed; a protective film forming step of evaporating the water content of the aqueous solution to form a protective film on the face side after the covering step is performed; and a laser processing step of applying a laser beam having a wavelength that is absorbable by the device wafer to the device wafer along the projected dicing lines to form laser-processed grooves in the device wafer along the projected dicing lines after the protective film forming step is performed.

In the method of laser-processing a device wafer according to the present invention, after supplying the face side of the device wafer with water and a powdery protective film agent to cover the face side with an aqueous solution in which the powdery protective film agent is dispersed, the water content of the aqueous solution is evaporated to form a protective film on the face side. The water and the powdery protective film agent are mixed into the aqueous solution to cover the face side of the device wafer therewith at the time the face side of the device wafer is to be covered with the aqueous solution. The powdery protective film agent is less bulky, easier to carry, transport, and manage, and less costly to manufacture laser-processed device wafers than the conventional liquid resin.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
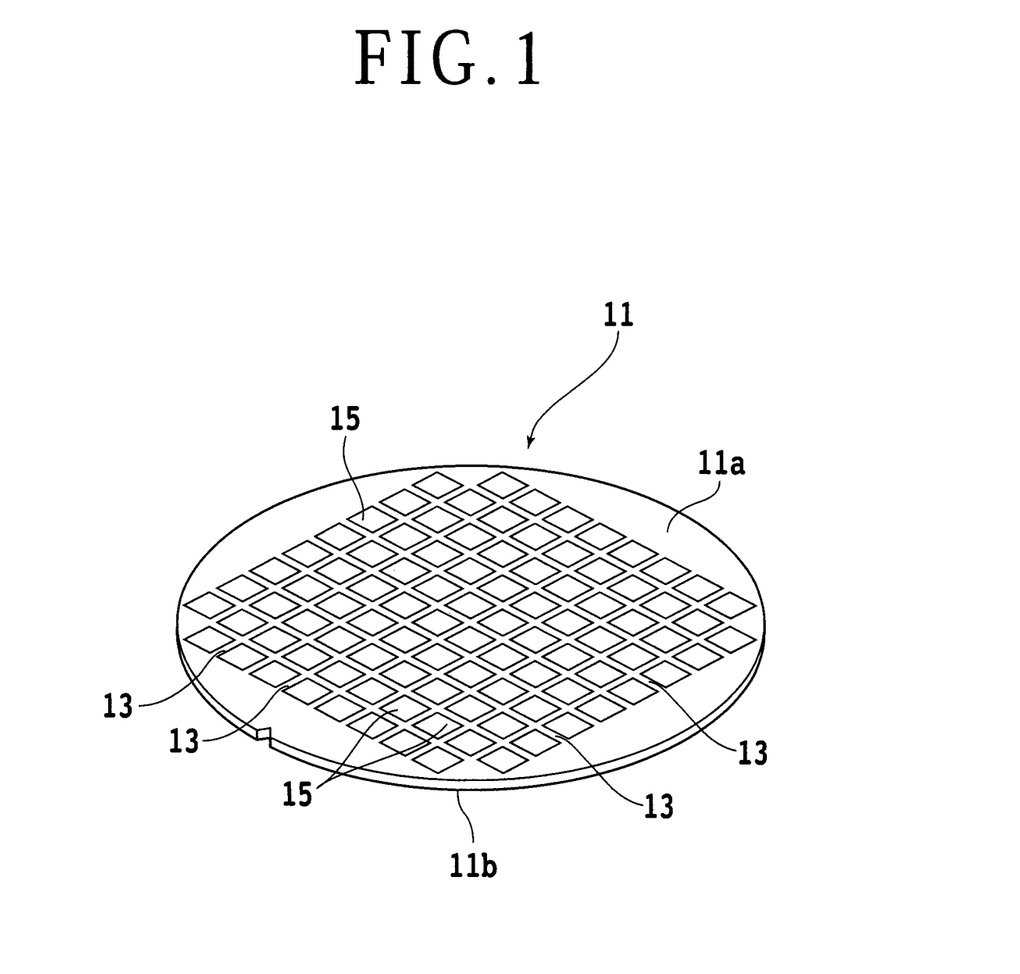
FIG. 1 is a perspective view of a device wafer, depicting a face side thereof.

A method of laser-processing a device wafer according to an embodiment of the present invention will be described in detail below with reference to the drawings. FIG. 1 depicts in perspective a face side 11a of a device wafer 11 such as a semiconductor wafer, an optical device wafer, or the like. The device wafer 11 has a grid of projected dicing lines 13 formed on the face side 11a, demarcating areas in which devices 15 such as semiconductor devices, optical devices, or the like are formed. The device wafer 11 also has a reverse side 11b opposite the face side 11a.

Figure 2:
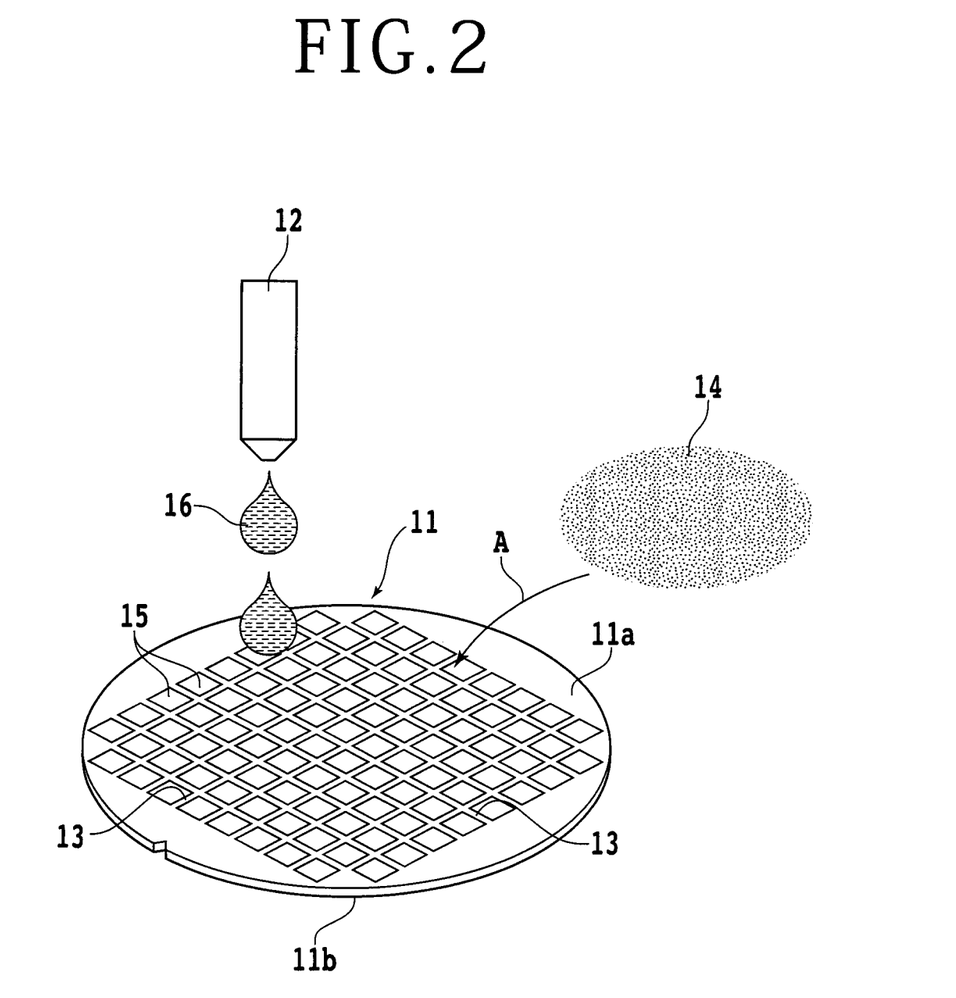
FIG. 2 is a perspective view depicting a covering step in which the face side of the device wafer is supplied with a powdery protective film agent and water to cover the face side of the device wafer with an aqueous solution of protective film agent.
Figure 3:
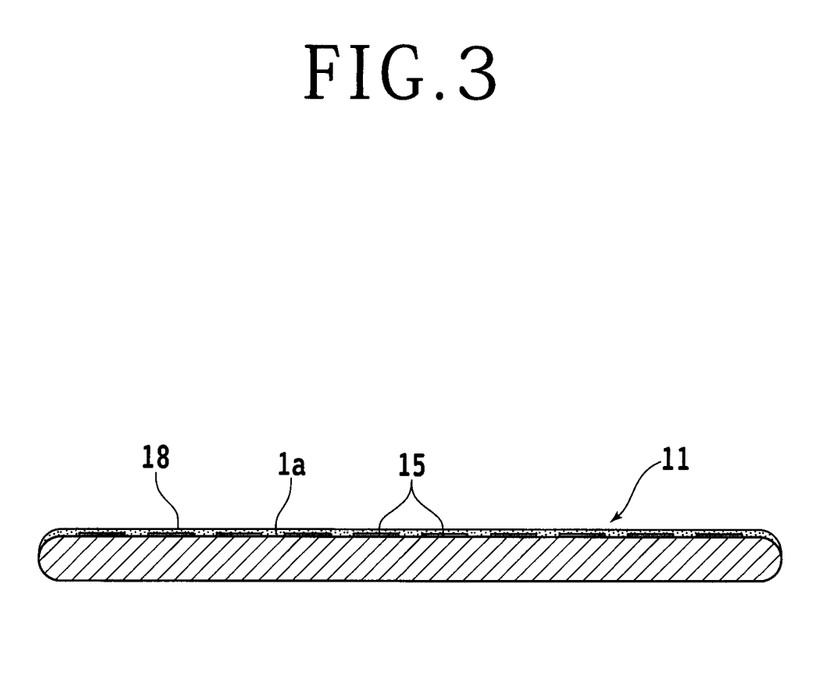
FIG. 3 is a cross-sectional view of the wafer, depicting the manner in which the face side of the device wafer is covered with the aqueous solution of protective film agent.

In the method of laser-processing a device wafer according to the present embodiment, as depicted in FIG. 2, a powdery protective film agent 14 is supplied to the face side 11a of the device wafer 11 as indicated by the arrow A, uniformly covering the face side 11a with the powdery protective film agent 14. At the same time or about at the time that the powdery protective film agent 14 is supplied to the face side 11a, water 16 such as pure water, city water, or the like is supplied from a nozzle 12 to the face side 11a, thereby covering the face side 11a with an aqueous solution 18 of protective film agent in which the powdery protective film agent 14 is dispersed, as depicted in FIG. 3. The powdery protective film agent 14 (i.e., the protective film agent in dry powder form) may be supplied at the same time that the water 16 is supplied, or the water 16 may be supplied after the powdery protective film agent 14 (i.e., the protective film agent in dry powder form) is supplied, or conversely the powdery protective film agent 14 (i.e., the protective film agent in dry powder form) may be supplied after the water 16 is supplied.

The powdery protective film agent 14 is not limited to any particular materials but may be any materials insofar as they can be dissolved in water, applied, and dried to form a protective film. For example, polyvinyl alcohol, polyethylene glycol, polyvinyl pyrrolidone, polyethylene oxide, methyl cellulose, ethyl cellulose, hydroxypropyl cellulose, polyacrylic acid, polyglycerin, etc. may be illustrated by way of example, and a powdery form of any of these resins can be used as the powdery protective film agent 14. According to the present embodiment, a powdery type of polyvinyl alcohol (PVA) is used. Polyvinyl alcohol can be manufactured by polymerizing vinyl acetate monomer and saponifying the obtained polyvinyl acetate resin. Polyvinyl alcohol is a water-soluble resin that is well soluble in water and is almost not soluble in oil.

Figure 4:
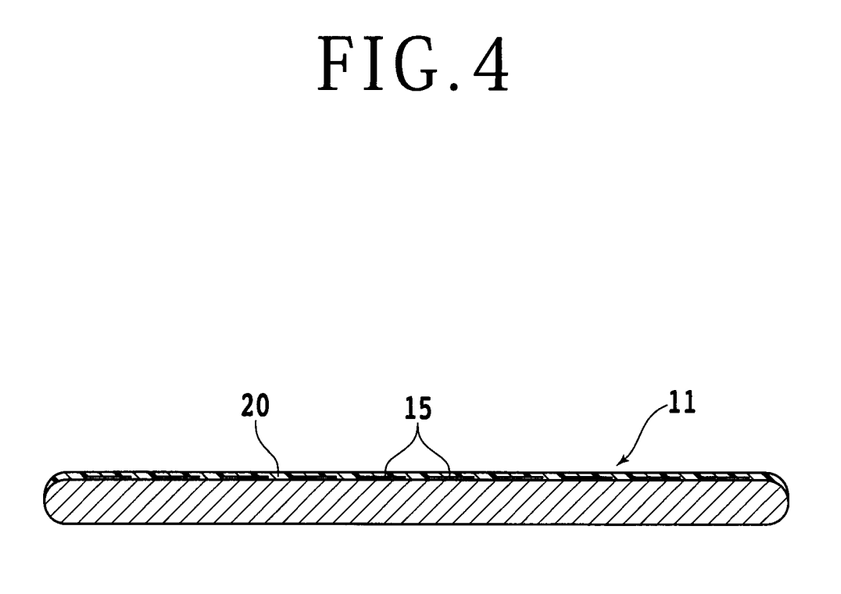
FIG. 4 is a cross-sectional view of the wafer, depicting the manner in which the water content of the aqueous solution of protective film agent is evaporated, forming a protective film on the face side of the device wafer.

After the covering step of covering the face side 11a of the device wafer 11 with the aqueous solution 18 of protective film agent in which the powdery protective film agent 14 is dispersed, a protective film forming step is carried out to evaporate the water content of the aqueous solution 18 of protective film agent, forming a water-soluble protective film 20 on the face side 11a of the device wafer 11 as depicted in FIG. 4. In the protective film forming step, specifically, the aqueous solution 18 of protective film agent is heated at a temperature in the range of 60° C. to 70° C. to disperse the powdery protective film agent 14 uniformly in the water and evaporate the water content of the aqueous solution 18 of protective film agent, forming the water-soluble protective film 20. The temperature at which to heat the aqueous solution 18 of protective film agent should preferably not reach 100° C. Alternatively, after the covering step of covering the face side 11a of the device wafer 11 with the aqueous solution 18 of protective film agent, the aqueous solution 18 of protective film agent may not be heated but may be naturally dried to form the water-soluble protective film 20 though it takes a bit of a while.

The protective film forming step is followed by a laser processing step in which a pulsed laser beam having a wavelength (e.g., a wavelength of 355 nm) absorbable by the device wafer 11 is applied to the device wafer 11 along the projected dicing lines 13, forming laser-processed grooves in the device wafer 11 along the projected dicing lines 13 by way of ablation.

Figure 5:
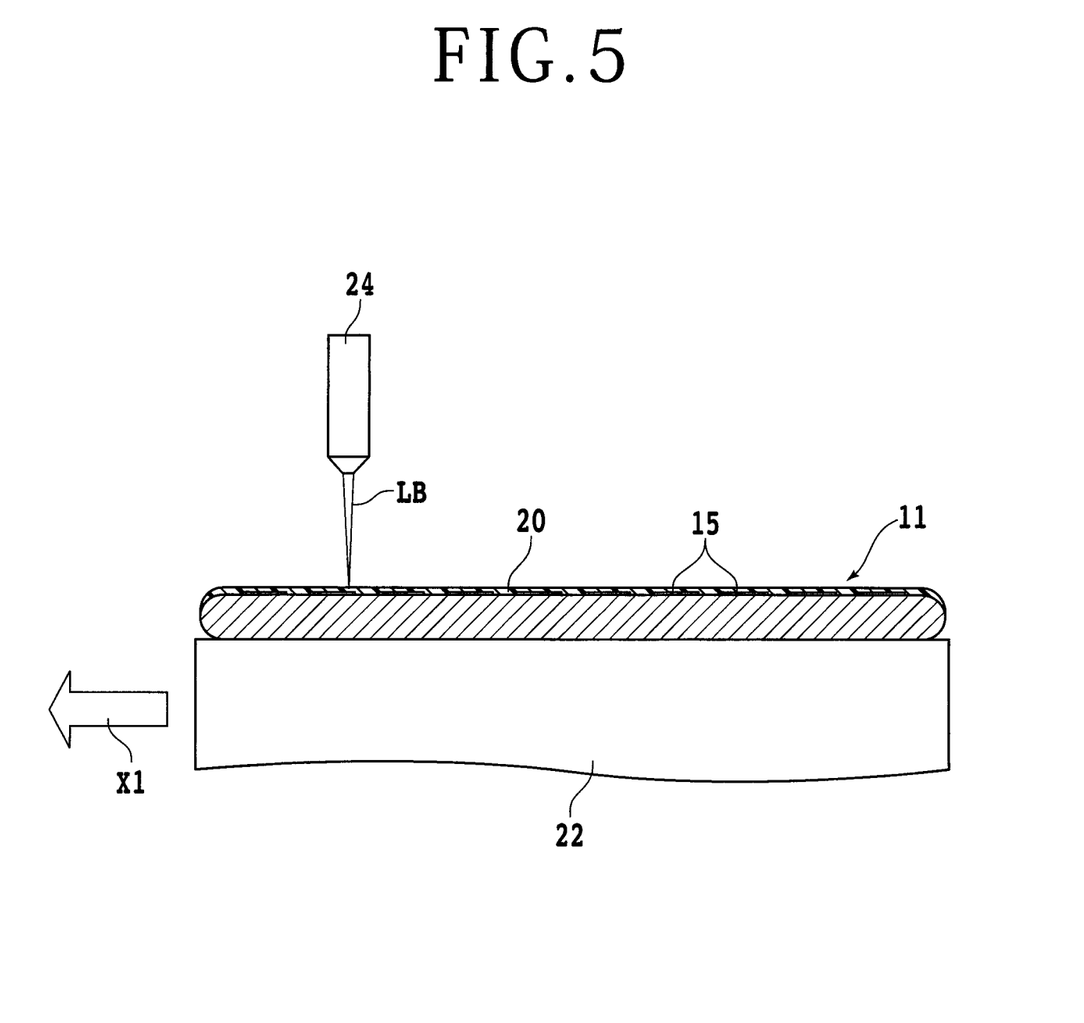
FIG. 5 is a side elevational view, partly in cross section, depicting a laser processing step.

In the laser processing step, as depicted in FIG. 5, the device wafer 11 with the water-soluble protective film 20 formed on the face side 11a thereof is held under suction on a chuck table 22 of a laser processing apparatus. Then, an image processing step such as pattern matching or the like is carried out and a known alignment step for aligning a laser beam spot on the device wafer 11 is performed to place a beam condenser 24 of a laser beam applying unit for applying a pulsed laser beam LB in alignment with those projected dicing lines 13 that extend in a first direction. The similar alignment step is also performed to place the beam condenser 24 in alignment with those projected dicing lines 13 that extend in a second direction which extends perpendicularly to the first direction.

After the alignment steps have been performed, the chuck table 22 is moved to position the processing starting point on a predetermined projected dicing line 13 extending in the first direction, directly below the beam condenser 24, and then the beam condenser 24 focuses the pulsed laser beam LB emitted therefrom onto the face side 11a of the device wafer 11 through the water-soluble protective film 20. While the beam condenser 24 is focusing the pulsed laser beam LB on the face side 11a of the device wafer 11 through the water-soluble protective film 20, the chuck table 22 is processing-fed in the direction indicated by the arrow X1 at a predetermined feed speed of 100 mm/second, for example, thereby forming a laser-processed groove by way of ablation in the face side 11a of the device wafer 11 along the projected dicing line 13.

After the laser-processed groove has been formed in the face side 11a of the device wafer 11 along the projected dicing line 13, the chuck table 22 is indexing-fed in a direction perpendicular to the direction indicated by the arrow X1 by a distance corresponding to the pitch of the projected dicing lines 13, and then a laser-processed groove is formed in the face side 11a of the device wafer 11 along a next projected dicing line 13 in the same manner as described above. The above process is repeated until laser-processed grooves are formed in the face side 11a of the device wafer 11 along all the projected dicing lines 13 that extend in the first direction. Thereafter, the chuck table 22 is turned 90° about its own axis, followed by a repetition of the above step to form laser-processed grooves by way of ablation in the face side 11a of the device wafer 11 along all the projected dicing lines 13 that extend in the second direction. During the laser processing step, the pulsed laser beam LB applied to the device wafer 11 produces debris due to its thermal energy. However, the debris is blocked by the water-soluble protective film 20 and prevented from being deposited on electronic circuits, bumps, etc. of the devices 15.

The semiconductor devices formed as the devices 15 on the device wafer 11 include many layers of metal interconnects for transmitting signals. These metal interconnects are insulated by inter-layer insulation films that are primarily made of $SiO_2$. As semiconductor devices have become more and more microstructured in recent years, the distance between interconnects thereof is reduced, increasing electric capacitances between closely positioned interconnects. The increased electric capacitances have led to signal delays, resulting in an increase in electric power consumed by the semiconductor devices.

The inter-layer insulation films that are used to insulate the layers of metal interconnects at the time the semiconductor devices or circuits are formed have heretofore been chiefly made of $SiO_2$. In an effort to reduce the parasitic capacitances between the layers more effectively, low-dielectric-constant (low-k) insulation films whose dielectric constants are lower than the $SiO_2$ insulation films have recently been used as inter-layer insulation films. Low-k insulation films are made of materials whose dielectric constants (e.g., k=2.5 through 3.6) are lower than the $SiO_2$ insulation films whose dielectric constant is k=4.1. For example, low-k insulation films may be inorganic films of SiOC, SiLK, and the like, organic polymer films of polyimide, parylene, polytetrafluoroethylene, and the like, and porous silica films of methyl-containing polysiloxane and the like.

If the device wafer 11 incorporates low-k films as inter-layer insulation films, then when the device wafer 11 is cut along the projected dicing lines 13 by a cutting blade, the laminated assembly including the inter-layer insulation films tends to be peeled off because the low-k films are brittle just like something made of mica. The laser processing step according to the present embodiment is preferable in solving the above problem because laser-processed grooves are formed by way of ablation in the device wafer 11 along the projected dicing lines 13 by applying the pulsed laser beam LB having a wavelength that is absorbable by the device wafer 11 along the projected dicing lines 13.

After the laser processing step, the device wafer 11 is delivered to a spinner cleaning apparatus which is usually incorporated in the laser processing apparatus. In the spinner cleaning apparatus, while the device wafer 11 is rotating at a low speed, a cleaning water nozzle ejects pure water to the device wafer 11, cleaning the device wafer 11 to remove the water-soluble protective film 20 therefrom. After the device wafer 11 is thus cleaned, it is spin-dried.

Figure 6:
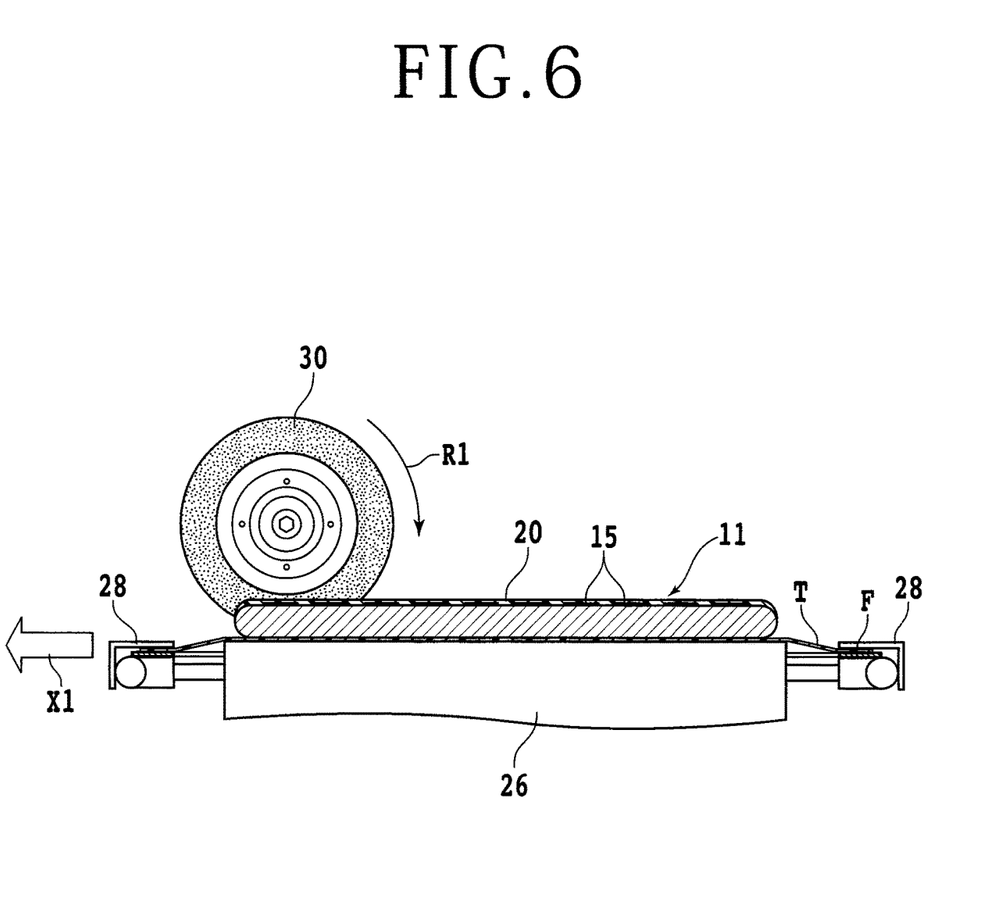
FIG. 6 is a side elevational view, partly in cross section, depicting a cutting step.

After the device wafer 11 is cleaned and dried, the device wafer 11 is applied to a dicing tape T (see FIG. 6) whose outer circumferential portion is bonded to an annular frame F, thereby making up a frame unit. Then, as depicted in FIG. 6, the frame unit is placed on a chuck table 26 of a cutting apparatus, whereupon the device wafer 11 is held under suction on the chuck table 26 through the dicing tape T and the annular frame F is clamped in position by clamps 28.

Then, a cutting blade 30 that is rotating about its own axis at a high speed in the direction indicated by the arrow R1 is displaced to cut into the device wafer 11 until the cutting blade 30 reaches the dicing tape T, and the chuck table 26 is processing-fed in the direction indicated by the arrow X1, cutting the device wafer 11 along one of the laser-processed grooves. The process is repeated to cut the device wafer 11 along all the laser-processed grooves, thereby dividing the device wafer 11 into individual device chips.

The above dividing step to divide the device wafer 11 is not limited to the use of the cutting blade 30. Rather, the device wafer 11 with the laser-processed grooves formed therein may be mounted in a breaking apparatus, and the breaking apparatus may exert external forces to the device wafer 11 to divide the device wafer 11 into individual device chips.

In the method of laser-processing a device wafer according to the present embodiment described above, the face side 11a of the device wafer 11 is supplied with water and the powdery protective film agent 14, so that it is covered with the aqueous solution 18 of protective film agent, after which the water content of the aqueous solution 18 of protective film agent is evaporated to form the water-soluble protective film 20 on the face side 11a of the device wafer 11.

The water-soluble protective film agent such as PVA or the like is transported in a powdery form to the site where the protective film is to be formed, and the powdery protective film agent 14 and the water 16 are mixed at the site into the aqueous solution 18 of protective film agent, with which the face side 11a of the device wafer 11 is covered. The powdery protective film agent 14 is less bulky, easier to carry, transport, and manage, and less costly to manufacture laser-processed device wafers than the conventional liquid resin.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of laser-processing a device wafer with a laser beam applied thereto, the device wafer having a face side having thereon a plurality of crossing projected dicing lines and devices formed in respective areas demarcated by the projected dicing lines, the method comprising:

a covering step of supplying the face side of the device wafer with water from a nozzle, and of separately supplying the face side of the device wafer with a resin in dry powder form, to thereby cover said face side with an aqueous solution in which said resin in dry powder form is dispersed in the water;

a protective film forming step of evaporating the water content of said aqueous solution to form a protective film on said face side after the covering step is performed; and a laser processing step of applying a laser beam having a wavelength that is absorbable by said device wafer to the device wafer along said projected dicing lines to form laser-processed grooves in said device wafer along said projected dicing lines after the protective film forming step is performed.

2. The method according to claim 1, wherein during the covering step, the water is supplied after the resin in dry powder form is supplied.

3. The method according to claim 1, wherein during the covering step, the water is supplied before the resin in dry powder form is supplied.

4. The method according to claim 1, wherein during the covering step, the water is supplied at the same time that the resin in dry powder form is supplied.

* * * * *